United States Patent [19]
Kengeri et al.

[11] Patent Number: 5,808,959
[45] Date of Patent: Sep. 15, 1998

[54] STAGGERED PIPELINE ACCESS SCHEME FOR SYNCHRONOUS RANDOM ACCESS MEMORY

[75] Inventors: Subramani Kengeri, San Jose; Darryl G. Walker, Santa Clara; Kenneth A. Poteet, San Jose; Chitranjan N. Reddy, Los Alto Hills, all of Calif.

[73] Assignee: Alliance Semiconductor Corporation, San Jose, Calif.

[21] Appl. No.: 612,044

[22] Filed: Aug. 7, 1996

(Under 37 CFR 1.47)

[51] Int. Cl.[6] .......................................................... G11C 8/00
[52] U.S. Cl. ................ 365/233; 365/230.06; 365/230.08; 365/233.5
[58] Field of Search ................................. 365/233, 230.06, 365/230.08, 233.5

[56] References Cited

U.S. PATENT DOCUMENTS

| | | | |
|---|---|---|---|
| 4,845,677 | 7/1989 | Chappell et al. | 365/189.02 |
| 5,126,975 | 6/1992 | Handy et al. | 365/233 X |
| 5,193,076 | 3/1993 | Houston | 365/233.5 |
| 5,287,327 | 2/1994 | Takasugi | 365/233.5 X |
| 5,341,341 | 8/1994 | Fukuzo | 365/233 |
| 5,410,670 | 4/1995 | Hansen et al. | 395/425 |
| 5,548,560 | 8/1996 | Stephens, Jr. et al. | 365/233.5 |
| 5,559,752 | 9/1996 | Stephens, Jr. et al. | 365/233 |
| 5,581,512 | 12/1996 | Kitamura | 365/233 |
| 5,592,435 | 1/1997 | Mills et al. | 365/233.5 |
| 5,666,324 | 9/1997 | Kosugi et al. | 365/233.5 X |

*Primary Examiner*—Do Hyun Yoo
*Attorney, Agent, or Firm*—Bradley T. Sako; Abdy Raissinia

[57] ABSTRACT

A static random access memory (SRAM) (10) operating in synchronism with an external clock is disclosed. The synchronous SRAM (10) includes a transparent address circuit (14) for decoding an external address in the set-up time prior to the rising edge of the external clock. A timing and control circuit (18) generates a word line enable (WLE) signal in synchronism with the rising edge of the external clock. When active, WLE activates a word line driver (34), when inactive, WLE equalizes the bit lines. WLE is applied to a first delay circuit (60) to generate a sense signal (SA). SA activates a sense circuit (46) and deactivates the WLE signal. Consecutive pipelined accesses are achieved such that, as an address is decoded, the bit lines are equalizing and the data from the previous address are propagating through a data I/O path (16).

10 Claims, 5 Drawing Sheets

STAGGERED PIPELINE ACCESS SCHEME FOR SYNCHRONOUS RANDOM ACCESS MEMORY

TECHNICAL FIELD

The present invention relates generally to synchronous random access memories (RAMs), and more particularly to address and timing circuits for synchronous RAMs.

BACKGROUND OF THE INVENTION

The most cost effective form of computer system random access memory continues to be the conventional dynamic random access memory (DRAM). At the same time, system bus speeds continue to outpace conventional DRAM cycle times. To overcome the limited speeds of DRAMs it is well known in the art to use a cache RAM system employing one or more levels of fast RAM devices between the microprocessor and the system RAM in order to increase system performance.

Cache RAMs are typically composed of static random access memories (SRAMs). SRAMs have faster cycle times than DRAMs and eliminate the need to refresh memory cells. However, as microprocessor clock speeds push well past 100 MHz, it is increasingly difficult to produce SRAMs having fast enough cycle times using conventional design approaches.

SRAMs include both asynchronous SRAMs and synchronous SRAMs. As is well understood in the art, asynchronous SRAMs are self-timed, typically by detecting a change in the external address received from the system. In contrast, synchronous SRAMs operate in synchronism with an external clock. This can be particularly advantageous in burst read and/or write operations where a series of memory locations are accessed in response to a single external address.

U.S. Pat. No. 5,126,975 issued to Handy et al. on Jun. 30, 1992 discloses a synchronous SRAM having a burst read and a burst write capability. The external address is latched on a clock edge to generate an internal address, this address is then applied to an SRAM array.

An example of a synchronous DRAM is disclosed in U.S. Pat. No. 5,341,341 issued to Yukio Fukuzo on Aug. 23, 1994. The synchronous DRAM has three operating sections; an addressing section (ADD), a data accessing section (RAMP), and a data read-out section (ROUT). These sections are pipelined according to one of three modes. In the first mode, during each clock edge, data are passed from one section to the next. In a second mode, the second section follows from the first, without clocking. In a third mode, the first, second and third sections follow sequentially from each clock edge.

It is known in the prior art to reduce cell access times by carefully executed timing sequences. U.S. Pat. No. 4,845,677 issued to Chappell et al. on Jul. 4, 1989 discloses a memory chip having a number of sub-arrays having local decoding and precharging. Block-to-block self-timing is used in the critical paths of the circuit.

Commonly owned, U.S. Pat. application Ser. No. 514,693 entitled TIMING CONTROL CIRCUIT FOR SYNCHRONOUS STATIC RANDOM ACCESS MEMORY, now U.S. Pat. No. 5,559,752, discloses a timing control circuit that includes a read/write sequence for sequentially activating sense circuits in an I/O path to access a memory cell. In a reset sequence the I/O path is pre-charged and equalized. The reset sequence is initiated before the data has completely propagated through the I/O path, reducing the overall cycle time of the device.

SUMMARY OF THE INVENTION

It is an object of the present invention to provide a synchronous RAM having a shorter cycle time than prior art approaches.

According to the present invention a synchronous RAM includes an array having a plurality of memory cells accessed by bit lines and word lines. An externally applied address selects a particular word line and column. Unlike prior art synchronous RAMs, where the externally applied address is latched and then predecoded after the rising edge of a clock signal, according to the present invention, the externally applied address is self-buffered and decoded in a transparent decoder circuit prior to the rising edge of the clock signal, taking advantage of address set-up time.

According to another aspect of the present invention, the selected word lines are driven by a word line driver circuit that is enabled by a word line enable signal. The word line enable signal is driven to an active state by the external clock signal. The active edge of the word line enable signal is coupled to a delay circuit to generate a first sense signal which activates sense circuits coupled to the bit lines. Concurrently, the first sense signal is fed back along a reset path to disable the word line enable signal and activate bit line equalization circuits. The propagation delay introduced by the reset path is sufficient to allow the sense circuits to sense the data on the bit lines.

According to another aspect of the present invention, accesses to the memory array are pipelined, with bit line equalization, data sense/latching, and address decoding occurring simultaneously.

An advantage of the present invention is that address set-up time is used to decode the address signal.

Yet another advantage of the present invention is that the same signal used to activate the sense amplifiers is used to deactivate the word line driver and activate the bit line equalization circuit, resulting in a minimal cycle time.

Yet another advantage of the present invention is that data access can be overlapped in time allowing for a minimum cycle time that is the combination of a minimum word line driver time and a minimum bit line equalization.

Other objects and advantages of the present invention will become apparent in light of the following description thereof.

DETAILED DESCRIPTION OF THE EMBODIMENTS

Figure 1:
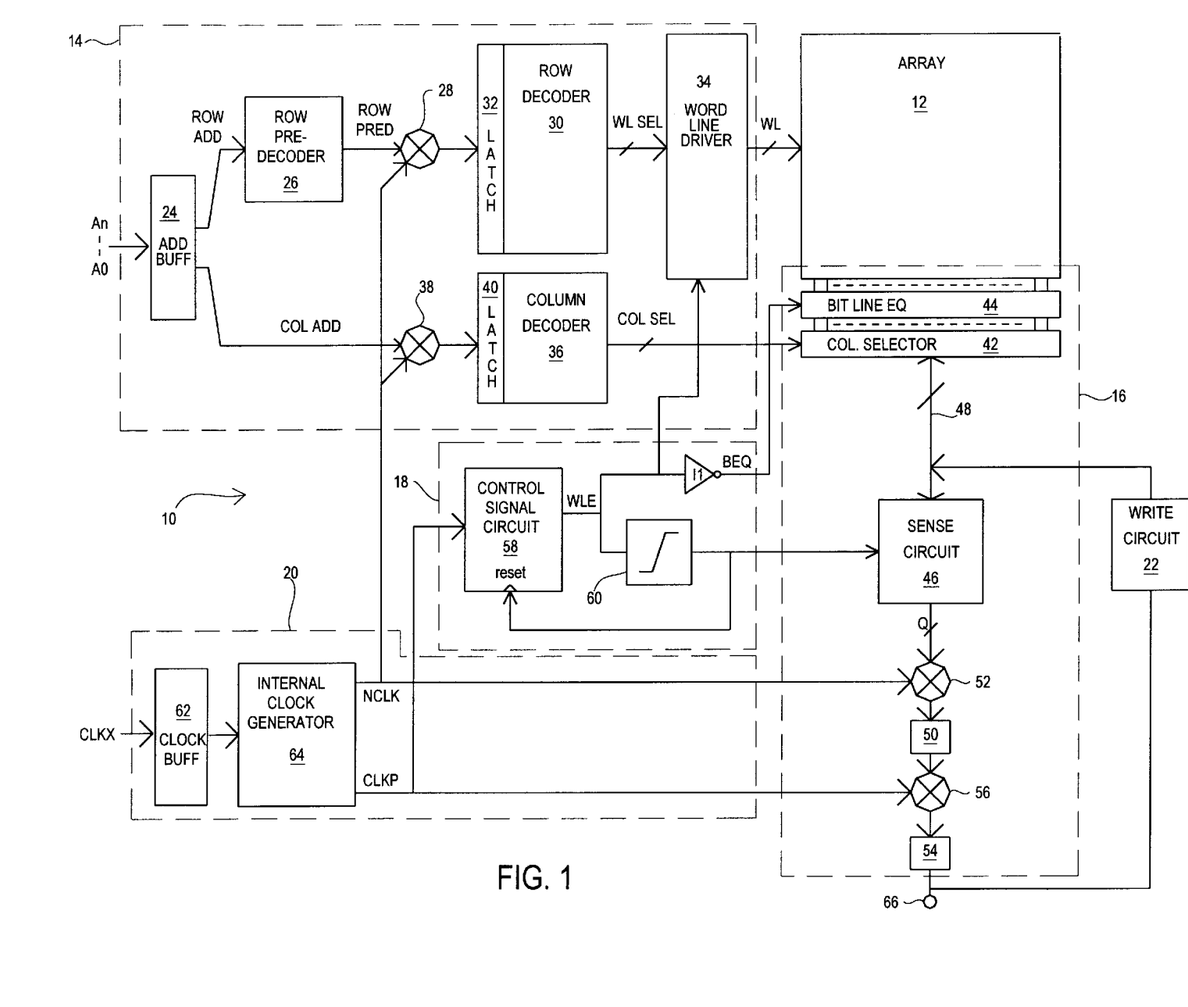
FIG. 1 is a block schematic diagram illustrating a preferred embodiment of the present invention.

FIG. 1 is a block schematic diagram setting forth, generally, a synchronous static random access memory (SRAM) according to a preferred embodiment of the present invention. The synchronous SRAM is designated by the general reference character 10, and is shown to include a memory array 12, an address circuit 14, a data input/output (I/O) path 16, a timing and control circuit 18, a clock circuit 20, and a write circuit 22.

The memory array 12 includes a large number of memory cells, each accessible by a particular word line/bit line combination. In a preferred embodiment the synchronous SRAM has a "by 32" configuration, thirty-two cells being accessed during any one cycle.

The address circuit 14 receives an externally applied memory address ($A_0$–$A_N$) and decodes the address to select the memory cell(s) corresponding thereto. The externally applied address is self-buffered in an address buffer 24. The buffered address is separated into a row address (ROW ADD) and a column address (COL ADD). The row address is coupled to a row predecoder 26 which translates the row address into row predecode signals (ROW PRED). A row address input gate 28 couples the row predecode signals to a row decoder 30.

The row decoder 30 generates a particular word line select signal (WL SEL) in response to each particular combination of row predecode signals. As set forth in FIG. 1, the row decoder 30 includes an input latch 32 for latching the row predecode signals. The word line select signal is applied to a word line driver 34 which is enabled by a word line enable (WLE) control signal. The derivation of WLE will be discussed at a later point herein. If WLE is active, the word line driver 34 drives a word line in the array 12 according to the particular word line select signal. The driven word line couples a row of memory cells to their respective bit lines.

The column address is coupled to a column decoder 36 by a column address input gate 38. The column decoder 36 includes a column decoder input latch 40 for storing the buffered column address. Based upon the column address, the column decoder 36 activates a particular column select signal (COL SEL) which is coupled to a column selector 42. The column selector 42, according to the column select signal, couples particular bit lines to the data I/O path 16.

It is noted that in address circuit 14, both the row and column address input gates (28 and 38) are responsive to an internal clock signal NCLK. NCLK is generally the inverse of the external system clock signal (CLKX). In the preferred embodiment set forth in FIG. 1, the timing cycle is initiated by the rising edge of the external clock signal. Accordingly, prior to the start of a timing cycle (during the address "set-up" time) the row address is predecoded, and decoded, flowing all the way through the address circuit 14 to the word line driver 34. Once the external clock goes high, starting the timing cycle, the row address input gate 28 is turned off, isolating the row decoder 30 from the row predecoder 26. Advantageously, the row predecoder 26 is situated prior to the row address input gate 28, allowing for row predecoding to take place as soon as a new row address is available at the address buffer 24.

In a similar fashion to the flow of the row address, the column address input gate 38 is controlled by the NCLK signal. The column address is passed through to the column decoder input latch 40 prior to the start of the timing cycle. It is noted that while not present in the preferred embodiment, a column predecoder could be situated prior to the column address input gate 38.

Referring once again to FIG. 1, the data I/O path 16 is shown to be coupled to the bit lines of the array 12. The bit lines of the array are coupled to a bit line equalization circuit 44. According to well understood techniques, when activated, the bit line equalization circuit 44 precharges and equalizes the bit lines to a voltage level that is intermediate a logic high and logic low.

The bit lines terminate in the column selector 42 which couples selected bit lines to a sense circuit 46 by way of a data bus 48. The sense circuit 46 operates in either a read mode or a write mode. In a read mode, the sense circuit 46 amplifies the differential voltage present on the selected bit lines to provide a sense data output (Q). The sense data output is coupled to a first I/O latch 50 by a first I/O gate 52. The output of the first I/O latch 50 is coupled to a second I/O latch 54 by a second I/O gate 56. In a write operation, the amplifying function of the sense circuit is disabled, and data are written by the write circuit 22 directly to the data bus 48.

The data I/O path 16 receives a number of timing and control signals. As set forth in the block schematic of FIG. 1, A bit line equalization signal (BEQ) activates the bit line equalization circuit 44, and sense amplifier enable signal (SA) activates the sense circuit. Further, the first I/O gate 52 is controlled by the NCLK signal while the second I/O gate 56 is controlled by a CLKP signal. The operation of the data I/O path 16 in conjunction with the control signals is described below.

The timing and control circuit 18 provides the critical timing signals WLE, BEQ and SA to the word line driver 34, the bit line equalization circuit 44, and the sense circuit 46, respectively. The timing and control circuit 18 includes a control signal circuit 58 which receives the internal clock signal CLKP. The rising edge of CLKP initiates the WLE signal. WLE is coupled to the word line driver circuit 44, inverter I1, and a first edge delay circuit 60. The inverter generates the BEQ signal, and the first edge delay 60 generates the SA signal. The first edge delay circuit 60 functions to introduce a delay in a low-to-high transition of the WLE signal. In a high-to-low transition, only negligible delay is introduced. The delay introduced by the first edge delay circuit 60 is intended to be adjustable. Such "one way" delay circuits are well understood in the art and so will not be discussed in any further detail herein.

It is noted that the SA signal is fed back to a reset input of the control signal circuit 58. Once the SA signal is generated, the WLE signal is reset (goes inactive). When WLE is inactive, due to the operation of the inverter I1, BEQ is active. In this manner, the same signal that activates the sense circuit 46 (SA), is used to reset the WLE signal and begin equalizing the data I/O path 16.

The clock circuit 20 receives the external clock signal at a clock buffer 62. The output of the clock buffer is applied to an internal clock signal generator 64. In response to the buffered external clock signal, the internal clock signal generator 64 provides the NCLK signal and the CLKP signal. The NCLK signal was previously described. The CLKP signal is an internal clock pulse signal synchronous with the external clock. In a preferred embodiment the positive portion of the CLKP duty cycle is longer than its negative portion.

Figure 2:
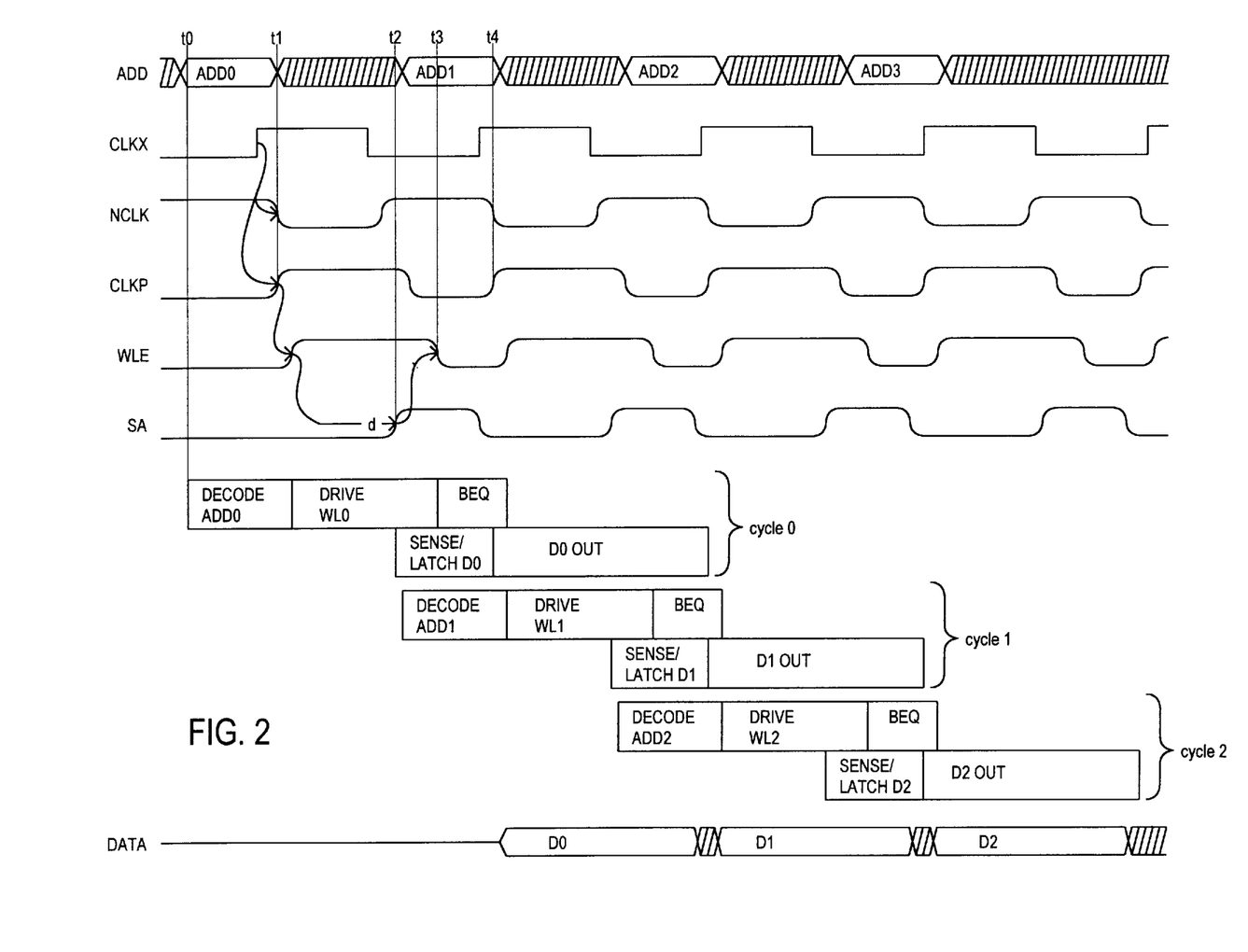
FIG. 2 is a timing diagram illustrating the operation of a preferred embodiment.

Referring now to FIG. 2 in conjunction with FIG. 1, the operation of a preferred embodiment will now be described. FIG. 2 is a timing diagram illustrating a read operation of three addresses according to a preferred embodiment. To assist in the description, a number of points in the timing cycle are shown at the top of the diagram (t0–t4).

The transition of the addresses at the input of the synchronous SRAM 10 are identified as ADD0–ADD2. Clock signals CLKX, NCLK, and CLKP are illustrated. In addition, control signals WLE and SA are also set forth. Below the control signals are illustrations of the three access cycles (cycle 0–2) corresponding to the three addresses. Finally, at the bottom of the timing diagram are the three data outputs corresponding to the three addresses.

At t0, the address buffer 24 receives the first address ADD0. Between t0 and t1, as previously described, NCLK is high, and the first address is decoded. The row address flows through the address circuit 14 and activates a word line select signal which is coupled to the word line driver 34. Concurrently, the column address flows through the address circuit 14 activating a column select signal. This is shown as "DECODE ADD0" in the first access cycle.

Shortly after CLKX goes high, at t1, NCLK goes low and CLKP goes high. With NCLK low, the row and column address input gates (28 and 38) are turned off, preventing any new address from propagating through the address circuit 14. It is noted that predecoded row address and the buffered column address of ADD0 remain latched in the row decoder input latch 32 and column decoder input latch 40, respectively.

The rising edge of CLKX generates the CLKP signal which initiates the internal timing and control operation. CLKP is coupled to the control signal circuit 58 where the rising edge of CLKP initiates the WLE signal. WLE enables the word line driver 34 which activates a word line in the array. At the same time BEQ is disabled and the bit lines are in a precharged state.

Between t1 and t2 the word line driver 34 drives a selected word line high, coupling a row of memory cells to the bit lines. The bit lines begin to develop a voltage differential ("split"). This is shown as "DRIVE WL0" in the first access cycle. In addition, during this time period WLE is propagating through the first edge delay circuit 60. This is represented by the "d" shown in conjunction with the SA signal.

At t2, WLE has passed through the first edge delay circuit 60 to generate the SA signal. Between t2 and t3, data on bit lines selected by the column selector 42 are amplified, latched, and begin propagating through the data I/O path 16. Further, during this time period the SA signal is being fed back to the reset input of the control signal circuit 58.

At t3, the SA signal has reset the WLE signal, and WLE goes low. The smallest amount of time required to drive the word line high, sense the data, and then reset the word line (t1–t3 or "DRIVE WL0" in FIG. 2) can be considered a minimum sense time. As WLE goes low, BEQ goes high, starting the equalization of the bit lines. The smallest amount of time required to drive BEQ high and equalize the bit lines (t3–t4 or "BEQ") can be considered a minimum equalization time.

Between t3 and t4, the sensed data propagate through the sense circuit 46. Because NCLK is high, the sensed data pass through the first I/O gate 52 and are latched in the first I/O latch 50. During the same time period, the bit line equalization is completed, and the word lines are ready to be driven again. Further, the second address ADD1 is presented at the address buffer 24, and because NCLK is low, the address flows through the address circuit 14 beginning the next access cycle (cycle 1).

Finally, at t4 CLKP goes high once more and the second I/O gate 56 is enabled, latching the sensed data in the second I/O latch 54. The data are then available at the data output 66. At the same time, the word line corresponding to ADD1 is driven high and the row and column address input gates (28 and 38) are disabled.

In this manner access cycles overlap in time (are pipelined) with subsequent access cycles proceeding in the same manner as cycle 0. It is noted that, in a preferred embodiment, the minimum cycle time (maximum CLKX frequency) is determined by the sum of the minimum bit line equalization time and the minimum sense time ("DRIVE WL"+"BEQ"). Hence, when the present invention is operating at its maximum speed, the WLE signal is consistently driven high for the minimum sense time and low for the minimum precharge time (assuming BEQ is the inverse of WLE).

While the above description sets forth a read operation, a write operation according to the present invention would be obvious to one skilled in the art. According to an externally applied write enable signal, the sense circuit 46 is disabled, and data on the data output 66 are driven on the data bus 48 by the write circuit 22. Data on the data bus 48 are written into the memory cells according to an externally applied address.

The timing diagram of FIG. 2 is intended to describe the general operation of a preferred embodiment. One skilled in the art would recognize that variations in the timing can occur, including the duration of the control signals, as well as the various segments comprising the access cycles. Accordingly, the particular timing arrangement presented by FIG. 2 should not be construed as limiting the present invention thereto.

It is also noted that the particular timing and control scheme set forth in FIG. 1 should not be construed as limiting. The WLE signal could be self-timed by a delay circuit unrelated to the SA signal. Further, the BEQ and SA signals could be timed off the CLKX signal, via delay circuits, and not be dependent upon the WLE signal.

Figure 3:
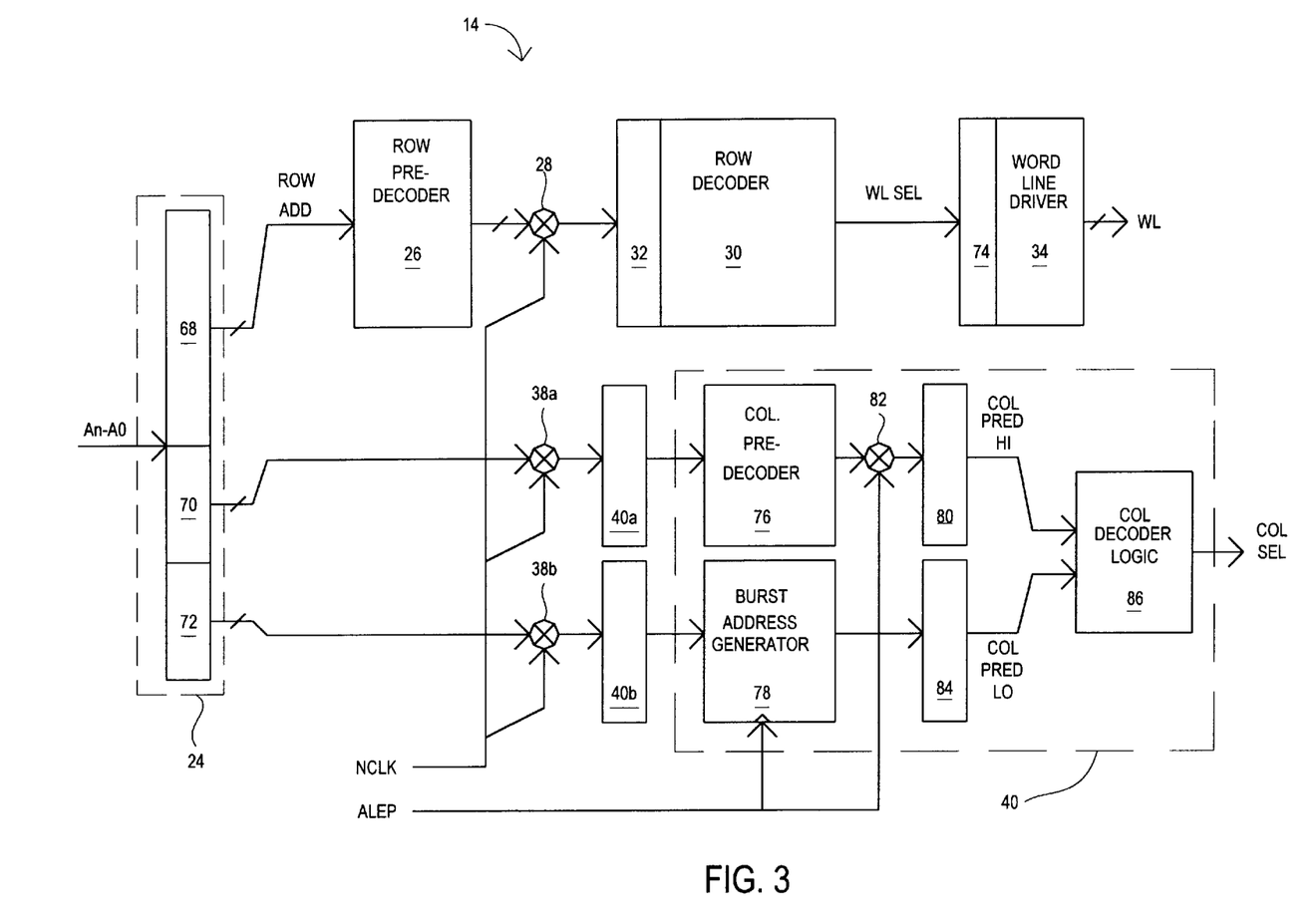
FIG. 3 is a block schematic diagram illustrating the addressing circuit of a preferred embodiment.

Referring now to FIG. 3, the address circuit 14 according to a preferred embodiment is set forth in more detail. The address buffer 24 is shown to include a row address buffer 68, a high column address buffer 70, and a low column address buffer 72. The row address buffer 68 couples the row address to the row predecoder 26. The remainder of the path for the row address is the same as that set forth in FIG. 1, except that the word line driver 34 includes a word line driver latch 74. The word line driver latch 74 latches the word line select signal received from the row decoder 30.

The high column address buffer 70 receives the high order bits of the column address, while the low address buffer 72 receives the low order bits. The column address input gate 38 is shown to include a high address input gate 38a and a low address input gate 38b. Similarly, the column decoder input latch includes a high address input latch 40a and a low address input latch 40b.

The column decoder 40 of a preferred embodiment is shown to include a column predecoder 76 coupled to the high address input latch 40a and a burst address generator 78 coupled to the low address input latch 40b. The column predecoder 76 provides a number of high order column predecode signals (COL PRED HI) which are coupled to high predecode output latch 80 by a passgate 82. The burst address generator 78 receives the low order bits of the column address and generates one or more sets of low order predecode signals (COL PRED LOW) which are latched in a burst address output latch 84.

Both the burst address generator 78 and passgate 82 are responsive to a clock pulse ALEP. ALEP is derived from the CLKP signal and one or more mode signals. If ALEP does not fire, the previous column predecode signals, or those provided by the burst address generator 78 will be coupled to latches 80 or 84.

If the ALEP pulse is generated, the high and low order column predecode signals are coupled to column decoder logic 86 which provides the column select signal to the column selector 42.

Figure 4:
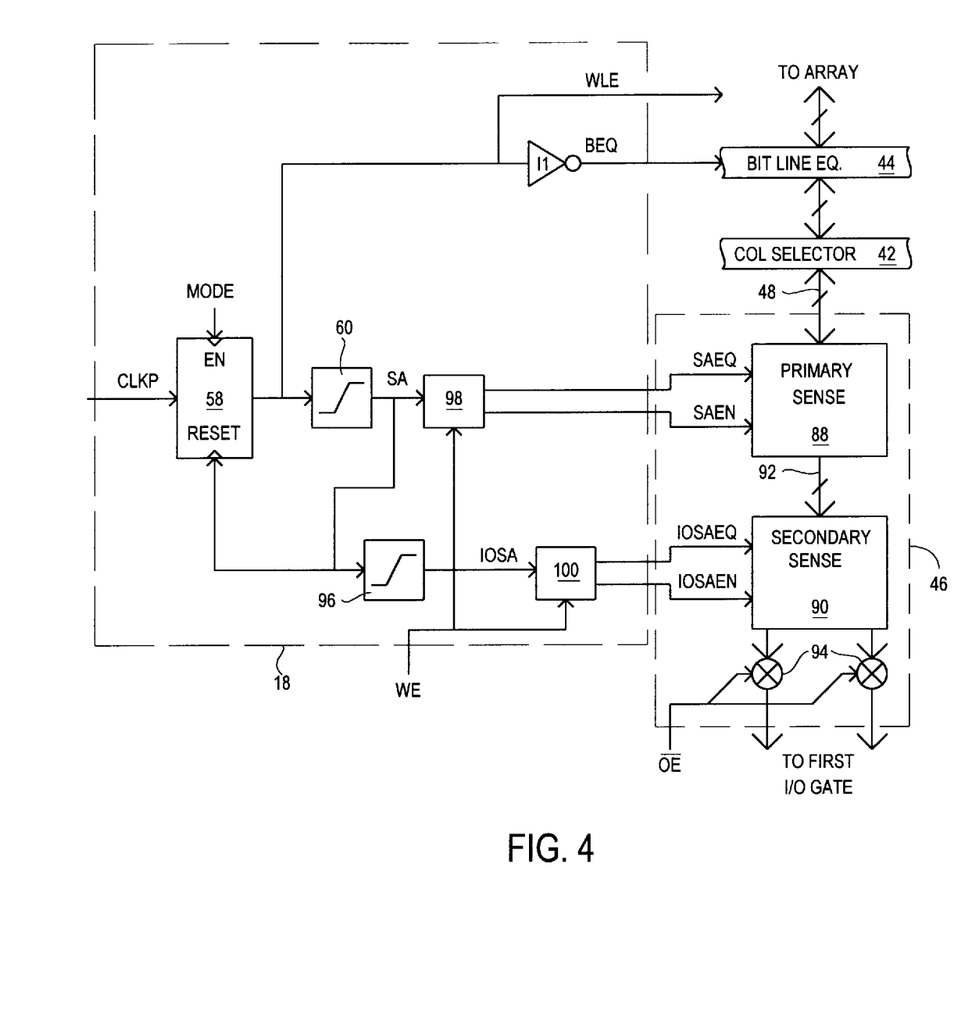
FIG. 4 is block schematic diagram illustrating the timing and control circuit and a portion of the data I/O path of a preferred embodiment.

Referring now to FIG. 4, there is shown a block schematic diagram illustrating the timing and control circuit 18 in conjunction with a portion of the data I/O path 16. For purposes of this description the data path of a single bit is represented. One skilled in the art would recognize that the data I/O path 18 is comprised of numerous such single bit I/O paths.

The sense circuit 46 of a preferred embodiment is shown to include a primary sense circuit 88 and a secondary sense circuit 90. The primary sense circuit 88 is operable in both a sense mode and an equalize mode. In the sense mode, in response to primary sense enable signals (SAEN), the primary sense circuit 88 amplifies the data on the bit lines to provide amplified data to the secondary sense circuit 90. In the equalize mode, in response to primary equalization signals (SAEQ), the primary sense circuit 88 precharges and equalizes the data bus 48.

In a similar manner, the secondary sense circuit 90 has both a sense and an equalize mode, initiated by secondary sense signals (IOSAEN) and secondary equalize signals (IOSAEQ), respectively. In the sense mode, data from the primary sense circuit 88 are amplified. In the equalize mode, I/O lines 92 leading into the secondary sense circuit 90 are precharged and equalized.

The output of sense circuit 46 is shown to include an output enable passgate 94 for preventing the data from passing to the first I/O gate 52 (not shown in FIG. 4). The generation of output enable signals from external control signals is well understood in the art, and so will not be discussed in further detail herein.

Referring once again to FIG. 4, the timing and control circuit 18, in addition to the control signal circuit 58 and first edge delay circuit 60 show in FIG. 1, further includes a second edge delay circuit 96, primary sense control logic 98, and secondary sense control logic 100. In response to a high SA signal, the primary sense control logic 98 activates the SAEN signals. Conversely, when SA goes low, the SAEQ signals are activated.

As mentioned previously, in addition to generating the SAEN/SAEQ signals, the SA signal is fed back to reset the WLE signal. Further, as shown in FIG. 4, SA is also applied to the second edge delay circuit 96 to generate an IOSA signal. Like the first edge delay circuit 60, the second edge delay circuit 96 introduces a delay, d2, in the rising edge of the SA signal, and a negligible delay in the falling edge. IOSA is then applied to the secondary sense control logic 100. If IOSA is high, the IOSAEN signals are generated. If IOSA is low, the IOSAEQ signal are generated. It is noted that both the primary and secondary sense control circuits (98 and 100) also receive a write enable input (WE). The WE signal indicates a write operation is to take place, and disables the SAEN/SAEQ and IOSAEN/IOSAEQ signals.

Figure 5:
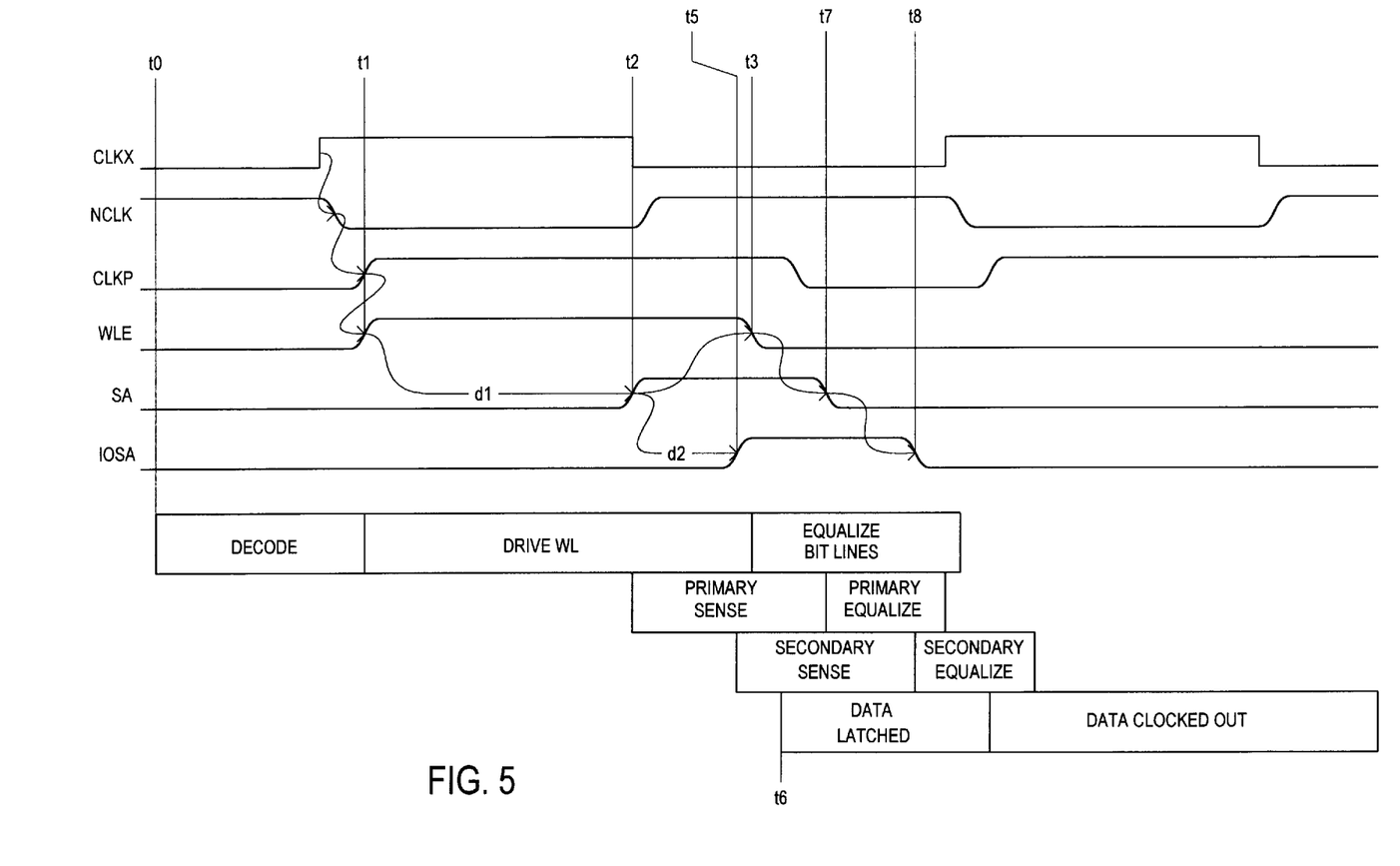
FIG. 5 is a timing diagram illustrating the operation of the timing and control circuit set forth in FIG. 4.

FIG. 5 is a timing diagram illustrating the operation of the timing and control circuit 18 of FIG. 4. The operation set forth in FIG. 4 is similar to that set forth in FIG. 2, and so includes the same timing points of FIG. 2 (t0–t4). Additional timing points t5–t8 are also included.

As in the case of FIG. 2, at t1 WLE goes high, and after delay d1, drives SA high. The rising edge of SA initiates the sense operation of the primary sense circuit 88 (shown as "PRIMARY SENSE"). SA is also applied to the second edge delay circuit 96, and after a delay d2, generates a rising IOSA signal. At t5, the rising IOSA edge initiates the sense operation of the secondary sense circuit 90 (shown as "SECONDARY SENSE"). In this manner the sensed data on selected bit lines are amplified in both sense circuits (88 and 90).

At t6, provided the output enable signal is low, sensed data have passed through the OE passgate 94 and the first I/O gate 52 and are latched in the first I/O latch 50.

At t7 SA goes low, and in response, the primary sense circuit 88 terminates the sense operation and begins the equalization operation (shown as "PRIMARY EQUALIZE"). In a similar manner, at t8, IOSA goes low and the secondary sense circuit 90 ceases the sense operation and initiated and equalization operation (shown as "SECONDARY EQUALIZE").

As set forth in FIG. 5, both primary and secondary sense operations occur as the bit lines are equalized. In addition, due to the propagation delay introduced by feeding SA back to reset the WLE signal, the primary sense operation starts before equalization of the bit lines begins. As in the case of FIG. 2, the particular duration and starting points of the timing segments and signals set forth in FIG. 5 are intended to be illustrative and should not be construed as limiting the present invention.

Accordingly, it is understood that the invention has been described in connection with its preferred embodiments, and may be changed, and other embodiments derived, without departing from the spirit and scope of the invention. The invention is intended to be limited only by the appended claims.

What we claim is:

1. A synchronous random access memory (RAM), comprising:

a memory array including a plurality of memory cells arranged in rows and columns accessed by a plurality of bit lines and word lines, the data stored within the memory cells being read from or written to by the application of an external address in synchronism with an external clock; and a transparent address circuit for receiving and decoding each of externally applied addresses prior to each active edge of the external clock to generate at least one word line select signal and at least one column select signal, wherein said each active edge of the external clock signal is generated by the external clock transitioning from an inactive state to an active state.

2. The synchronous RAM of claim 1, wherein:

said transparent address circuit includes input address gates responsive to the external clock.

3. The synchronous RAM of claim 1, wherein:

said transparent address circuit includes an address predecoder for receiving at least a portion of the external address and generating a plurality of predecode signals therefrom, and an address decoder for receiving the predecode signals and portions of the external address and generating therefrom the word line select signal and the column select signal.

4. The synchronous RAM of claim 3, wherein said transparent address circuit further includes:

input address gates responsive to the external clock coupling the predecode signals and the portions of the external address to the address decoder.

5. The synchronous RAM of claim 3, wherein:

the address predecoder is a row address predecoder, and the address decoder includes
- a row decoder circuit for generating the word line select signal, and
- a column decoder circuit for generating the column select signal.

6. The synchronous RAM of claim 5, wherein:

said transparent address circuit includes a burst address generator responsive to an external address and an external burst mode signal, for providing a series of column select signals in synchronism with the external clock.

7. The synchronous RAM of claim 1, including:

a word line driver circuit for activating the word lines including word line latching circuits for latching the word line select signal, said word line driver circuit being responsive to the word line select signal and a word line enable signal.

8. The synchronous RAM of claim 1, wherein: said transparent address circuit includes:
- an address predecoder for receiving at least a portion of the external address and generating a plurality of predecode signals therefrom, and
- an address decoder for receiving the predecode signals aid generating therefrom the word line select signal and the column select signal.

9. The synchronous RAM of claim 8, wherein said transparent address circuit further includes:

input address gates responsive to the external clock coupling the predecode signals to the address decoder.

10. The synchronous RAM of claim 8, wherein:

the address predecoder includes a row address predecoder and a column address predecoder, and the address decoder includes a row decoder circuit for generating the word line select signal; and a column decoder circuit for generating the column select signal.

* * * * *